US 8,739,626 B2

(12) United States Patent
Acar

(10) Patent No.: US 8,739,626 B2
(45) Date of Patent: Jun. 3, 2014

(54) MICROMACHINED INERTIAL SENSOR DEVICES

(75) Inventor: Cenk Acar, Irvine, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 289 days.

(21) Appl. No.: 12/849,742

(22) Filed: Aug. 3, 2010

(65) Prior Publication Data

US 2011/0030473 A1 Feb. 10, 2011

Related U.S. Application Data

(60) Provisional application No. 61/273,538, filed on Aug. 4, 2009, provisional application No. 61/273,494, filed on Aug. 4, 2009.

(51) Int. Cl.
*G01C 19/56* (2012.01)
(52) U.S. Cl.
USPC ..................................... 73/504.04; 73/504.12
(58) Field of Classification Search
USPC ............... 73/514.32, 514.29, 514.36, 514.38, 73/510, 511, 504.14, 504.04, 504.12
See application file for complete search history.

(56) References Cited

U.S. PATENT DOCUMENTS

| | | | |
|---|---|---|---|
| 5,487,305 A | 1/1996 | Ristic et al. | |
| 5,723,790 A * | 3/1998 | Andersson | ................. 73/514.36 |
| 5,751,154 A | 5/1998 | Tsugai | |
| 5,760,465 A | 6/1998 | Alcoe et al. | |
| 5,765,046 A | 6/1998 | Watanabe et al. | |
| 6,131,457 A | 10/2000 | Sato | |
| 6,214,644 B1 | 4/2001 | Glenn | |
| 6,351,996 B1 | 3/2002 | Nasiri et al. | |
| 6,366,468 B1 | 4/2002 | Pan | |
| 6,390,905 B1 | 5/2002 | Korovin et al. | |
| 6,501,282 B1 | 12/2002 | Dummermuth et al. | |
| 6,504,385 B2 * | 1/2003 | Hartwell et al. | ............... 324/662 |
| 6,553,835 B1 | 4/2003 | Hobbs et al. | |
| 6,722,206 B2 | 4/2004 | Takada | |
| 6,725,719 B2 | 4/2004 | Cardarelli | |
| 6,781,231 B2 | 8/2004 | Minervini et al. | |
| 6,848,304 B2 * | 2/2005 | Geen | .......................... 73/504.04 |

(Continued)

FOREIGN PATENT DOCUMENTS

| | | |
|---|---|---|
| CN | 1389704 A | 1/2003 |
| CN | 1816747 A | 8/2006 |

(Continued)

OTHER PUBLICATIONS

"International Application Serial No. PCT/US2010/002166, International Search Report mailed Feb. 28, 2011", 3 pgs.

(Continued)

*Primary Examiner* — Helen Kwok
(74) *Attorney, Agent, or Firm* — Schwegman, Lundberg & Woessner, P.A.

(57) ABSTRACT

A micromachined inertial sensor with a single proof-mass for measuring 6-degree-of-motions. The single proof-mass includes a frame, an x-axis proof mass section attached to the frame by a first flexure, and a y-axis proof mass section attached to the frame by a second flexure. The single proof-mass is formed in a micromachined structural layer and is adapted to measure angular rates about three axes with a single drive motion and linear accelerations about the three axes.

25 Claims, 9 Drawing Sheets

(56) References Cited

U.S. PATENT DOCUMENTS

| | | | |
|---|---|---|---|
| 7,051,590 B1 | 5/2006 | Lemkin et al. | |
| 7,093,487 B2 | 8/2006 | Mochida | |
| 7,166,910 B2 | 1/2007 | Minervini et al. | |
| 7,202,552 B2 | 4/2007 | Zhe et al. | |
| 7,210,351 B2* | 5/2007 | Lo et al. | 73/514.32 |
| 7,221,767 B2 | 5/2007 | Mullenborn et al. | |
| 7,240,552 B2* | 7/2007 | Acar et al. | 73/504.12 |
| 7,258,011 B2* | 8/2007 | Nasiri et al. | 73/514.32 |
| 7,258,012 B2* | 8/2007 | Xie | 73/514.32 |
| 7,293,460 B2* | 11/2007 | Zarabadi et al. | 73/514.32 |
| 7,301,212 B1 | 11/2007 | Mian et al. | |
| 7,305,880 B2 | 12/2007 | Caminada et al. | |
| 7,358,151 B2 | 4/2008 | Araki et al. | |
| 7,436,054 B2 | 10/2008 | Zhe | |
| 7,449,355 B2 | 11/2008 | Lutz et al. | |
| 7,518,493 B2 | 4/2009 | Bryzek et al. | |
| 7,539,003 B2 | 5/2009 | Ray | |
| 7,600,428 B2 | 10/2009 | Robert et al. | |
| 7,622,782 B2 | 11/2009 | Chu et al. | |
| 7,706,149 B2 | 4/2010 | Yang et al. | |
| 7,781,249 B2 | 8/2010 | Laming et al. | |
| 7,795,078 B2 | 9/2010 | Ramakrishna et al. | |
| 7,950,281 B2* | 5/2011 | Hammerschmidt | 73/504.04 |
| 8,006,557 B2* | 8/2011 | Yin et al. | 73/514.01 |
| 8,113,050 B2* | 2/2012 | Acar et al. | 73/504.04 |
| 8,171,792 B2* | 5/2012 | Sameshima | 73/504.04 |
| 8,201,449 B2* | 6/2012 | Ohuchi et al. | 73/504.12 |
| 8,250,921 B2* | 8/2012 | Nasiri et al. | 73/511 |
| 8,421,168 B2 | 4/2013 | Allen et al. | |
| 2002/0021059 A1 | 2/2002 | Knowles et al. | |
| 2002/0178831 A1 | 12/2002 | Takada | |
| 2003/0061878 A1 | 4/2003 | Pinson | |
| 2003/0200807 A1 | 10/2003 | Hulsing, II | |
| 2004/0119137 A1 | 6/2004 | Leonardi et al. | |
| 2004/0177689 A1 | 9/2004 | Cho | |
| 2004/0211258 A1 | 10/2004 | Geen | |
| 2004/0219340 A1 | 11/2004 | McNeil et al. | |
| 2004/0231420 A1 | 11/2004 | Xie et al. | |
| 2004/0251793 A1 | 12/2004 | Matsuhisa | |
| 2005/0005698 A1 | 1/2005 | McNeil et al. | |
| 2005/0139005 A1 | 6/2005 | Geen | |
| 2005/0189635 A1 | 9/2005 | Humpston et al. | |
| 2006/0032308 A1 | 2/2006 | Acar et al. | |
| 2006/0034472 A1 | 2/2006 | Bazarjani et al. | |
| 2006/0043608 A1 | 3/2006 | Bernier et al. | |
| 2006/0137457 A1 | 6/2006 | Zdeblick | |
| 2006/0207328 A1 | 9/2006 | Zarabadi et al. | |
| 2006/0213265 A1 | 9/2006 | Weber et al. | |
| 2006/0213266 A1 | 9/2006 | French et al. | |
| 2006/0213268 A1 | 9/2006 | Asami et al. | |
| 2006/0246631 A1 | 11/2006 | Lutz et al. | |
| 2007/0013052 A1 | 1/2007 | Zhe et al. | |
| 2007/0040231 A1 | 2/2007 | Harney et al. | |
| 2007/0047744 A1 | 3/2007 | Harney et al. | |
| 2007/0071268 A1 | 3/2007 | Harney et al. | |
| 2007/0085544 A1 | 4/2007 | Viswanathan | |
| 2007/0099327 A1 | 5/2007 | Hartzell et al. | |
| 2007/0114643 A1 | 5/2007 | DCamp et al. | |
| 2007/0165888 A1 | 7/2007 | Weigold | |
| 2007/0205492 A1 | 9/2007 | Wang | |
| 2007/0220973 A1* | 9/2007 | Acar | 73/504.12 |
| 2007/0222021 A1 | 9/2007 | Yao | |
| 2007/0284682 A1 | 12/2007 | Laming et al. | |
| 2008/0049230 A1 | 2/2008 | Chin et al. | |
| 2008/0081398 A1 | 4/2008 | Lee et al. | |
| 2008/0083958 A1 | 4/2008 | Wei et al. | |
| 2008/0083960 A1 | 4/2008 | Chen et al. | |
| 2008/0092652 A1* | 4/2008 | Acar | 73/504.02 |
| 2008/0122439 A1 | 5/2008 | Burdick et al. | |
| 2008/0157238 A1 | 7/2008 | Hsiao | |
| 2008/0157301 A1 | 7/2008 | Ramakrishna et al. | |
| 2008/0169811 A1 | 7/2008 | Viswanathan | |
| 2008/0202237 A1 | 8/2008 | Hammerschmidt | |
| 2008/0245148 A1 | 10/2008 | Fukumoto | |
| 2008/0247585 A1 | 10/2008 | Leidl et al. | |
| 2008/0251866 A1 | 10/2008 | Belt et al. | |
| 2008/0290756 A1 | 11/2008 | Huang | |
| 2008/0302559 A1 | 12/2008 | Leedy | |
| 2008/0314147 A1 | 12/2008 | Nasiri et al. | |
| 2009/0064780 A1 | 3/2009 | Coronato et al. | |
| 2009/0140606 A1 | 6/2009 | Huang | |
| 2009/0175477 A1 | 7/2009 | Suzuki et al. | |
| 2009/0183570 A1* | 7/2009 | Acar et al. | 73/514.32 |
| 2009/0194829 A1 | 8/2009 | Chung et al. | |
| 2009/0263937 A1 | 10/2009 | Ramakrishna et al. | |
| 2009/0266163 A1 | 10/2009 | Ohuchi et al. | |
| 2010/0019393 A1 | 1/2010 | Hsieh et al. | |
| 2010/0024548 A1 | 2/2010 | Cardarelli | |
| 2010/0038733 A1 | 2/2010 | Minervini | |
| 2010/0044853 A1 | 2/2010 | Dekker et al. | |
| 2010/0052082 A1 | 3/2010 | Lee | |
| 2010/0072626 A1 | 3/2010 | Theuss et al. | |
| 2010/0122579 A1 | 5/2010 | Hsu et al. | |
| 2010/0155863 A1 | 6/2010 | Weekamp | |
| 2010/0206074 A1 | 8/2010 | Yoshida et al. | |
| 2010/0212425 A1 | 8/2010 | Hsu et al. | |
| 2010/0224004 A1 | 9/2010 | Suminto et al. | |
| 2010/0236327 A1 | 9/2010 | Mao et al. | |
| 2011/0030474 A1 | 2/2011 | Kuang et al. | |
| 2011/0031565 A1 | 2/2011 | Marx et al. | |
| 2011/0094302 A1 | 4/2011 | Schofield et al. | |
| 2011/0121413 A1 | 5/2011 | Allen et al. | |
| 2011/0265564 A1 | 11/2011 | Acar et al. | |
| 2013/0139591 A1 | 6/2013 | Acar | |
| 2013/0139592 A1 | 6/2013 | Acar | |
| 2013/0192364 A1 | 8/2013 | Acar | |
| 2013/0192369 A1 | 8/2013 | Acar et al. | |
| 2013/0247666 A1 | 9/2013 | Acar | |
| 2013/0247668 A1 | 9/2013 | Bryzek | |
| 2013/0250532 A1 | 9/2013 | Bryzek et al. | |
| 2013/0257487 A1 | 10/2013 | Opris et al. | |
| 2013/0263641 A1 | 10/2013 | Opris et al. | |
| 2013/0263665 A1 | 10/2013 | Opris et al. | |
| 2013/0265070 A1 | 10/2013 | Kleks et al. | |
| 2013/0265183 A1 | 10/2013 | Kleks et al. | |
| 2013/0268227 A1 | 10/2013 | Opris et al. | |
| 2013/0268228 A1 | 10/2013 | Opris et al. | |
| 2013/0269413 A1 | 10/2013 | Tao et al. | |
| 2013/0270657 A1 | 10/2013 | Acar et al. | |
| 2013/0270660 A1 | 10/2013 | Bryzek et al. | |
| 2013/0271228 A1 | 10/2013 | Tao et al. | |
| 2013/0277772 A1 | 10/2013 | Bryzek et al. | |
| 2013/0277773 A1 | 10/2013 | Bryzek et al. | |
| 2013/0328139 A1 | 12/2013 | Acar | |
| 2013/0341737 A1 | 12/2013 | Bryzek et al. | |

FOREIGN PATENT DOCUMENTS

| | | |
|---|---|---|
| CN | 1948906 A | 4/2007 |
| CN | 101038299 A | 9/2007 |
| CN | 101180516 A | 5/2008 |
| CN | 101270988 A | 9/2008 |
| CN | 101426718 A | 5/2009 |
| CN | 101813480 A | 8/2010 |
| CN | 101858928 A | 10/2010 |
| CN | 102597699 A | 7/2012 |
| CN | 103209922 A | 7/2013 |
| CN | 103210278 A | 7/2013 |
| CN | 103221331 A | 7/2013 |
| CN | 103221332 A | 7/2013 |
| CN | 103221333 A | 7/2013 |
| CN | 103221778 A | 7/2013 |
| CN | 103221779 A | 7/2013 |
| CN | 103221795 A | 7/2013 |
| CN | 103238075 A | 8/2013 |
| CN | 103363969 A | 10/2013 |
| CN | 103363983 A | 10/2013 |
| CN | 103364590 A | 10/2013 |
| CN | 103364593 A | 10/2013 |
| CN | 103368503 A | 10/2013 |
| CN | 103368562 A | 10/2013 |
| CN | 103368577 A | 10/2013 |
| CN | 103376099 A | 10/2013 |
| CN | 103376102 A | 10/2013 |

(56) References Cited

FOREIGN PATENT DOCUMENTS

| | | |
|---|---|---|
| CN | 103403495 A | 11/2013 |
| CN | 103663344 A | 3/2014 |
| DE | 112011103124 T5 | 12/2013 |
| DE | 102013014881 A1 | 3/2014 |
| EP | 1460380 A1 | 9/2004 |
| EP | 1521086 A1 | 4/2005 |
| EP | 1688705 A2 | 8/2006 |
| EP | 1832841 A1 | 9/2007 |
| EP | 1860402 A1 | 11/2007 |
| EP | 2053413 A1 | 4/2009 |
| EP | 2259019 A1 | 12/2010 |
| JP | 09089927 A | 4/1997 |
| JP | 10239347 A | 9/1998 |
| JP | 2005024310 A | 1/2005 |
| JP | 2005114394 A | 4/2005 |
| JP | 2005294462 A | 10/2005 |
| JP | 2007024864 A | 2/2007 |
| JP | 2008294455 A | 12/2008 |
| JP | 2009075097 A | 4/2009 |
| JP | 2009186213 A | 8/2009 |
| JP | 2010025898 A | 2/2010 |
| JP | 2010506182 A | 2/2010 |
| KR | 1020110055449 A1 | 5/2011 |
| KR | 1020130052652 A | 5/2013 |
| KR | 1020130052653 A | 5/2013 |
| KR | 1020130054441 A | 5/2013 |
| KR | 1020130055693 A | 5/2013 |
| KR | 1020130057485 A | 5/2013 |
| KR | 1020130060338 A | 6/2013 |
| KR | 1020130061181 A | 6/2013 |
| KR | 101311966 B1 | 9/2013 |
| KR | 1020130097209 A | 9/2013 |
| KR | 101318810 B1 | 10/2013 |
| KR | 1020130037462 A | 10/2013 |
| KR | 1020130112789 A | 10/2013 |
| KR | 1020130112792 A | 10/2013 |
| KR | 1020130112804 A | 10/2013 |
| KR | 1020130113385 A | 10/2013 |
| KR | 1020130113386 A | 10/2013 |
| KR | 1020130113391 A | 10/2013 |
| KR | 1020130116189 A | 10/2013 |
| KR | 1020130116212 A | 10/2013 |
| KR | 101332701 B1 | 11/2013 |
| KR | 1020130139914 A | 12/2013 |
| KR | 1020130142116 A | 12/2013 |
| KR | 101352827 B1 | 1/2014 |
| KR | 1020140034713 A | 3/2014 |
| TW | I255341 B | 5/2006 |
| WO | WO-2008/059757 A1 | 5/2008 |
| WO | WO-2008087578 A2 | 7/2008 |
| WO | WO-2009050578 A2 | 4/2009 |
| WO | WO-2009156485 A1 | 12/2009 |
| WO | WO-2011/016859 A2 | 2/2011 |
| WO | WO-2011016859 A3 | 2/2011 |
| WO | WO-2012037492 A2 | 3/2012 |
| WO | WO-2012037492 A3 | 3/2012 |
| WO | WO-2012037501 A2 | 3/2012 |
| WO | WO-2012037501 A3 | 3/2012 |
| WO | WO-2012037536 A2 | 3/2012 |
| WO | WO-2012037537 A2 | 3/2012 |
| WO | WO-2012037538 A2 | 3/2012 |
| WO | WO-2012037539 A1 | 3/2012 |
| WO | WO-2012037539 A9 | 3/2012 |
| WO | WO-2012037540 A2 | 3/2012 |
| WO | WO-2012040194 A1 | 3/2012 |
| WO | WO-2012040211 A2 | 3/2012 |
| WO | WO-2012040245 A2 | 3/2012 |
| WO | WO-2012040245 A3 | 3/2012 |
| WO | WO-2013115967 A1 | 8/2013 |
| WO | WO-2013116356 A1 | 8/2013 |
| WO | WO-2013116514 A1 | 8/2013 |
| WO | WO-2013116522 A1 | 8/2013 |

OTHER PUBLICATIONS

"International Application Serial No. PCT/US2010/002166, Written Opinion mailed Feb. 28, 2011", 4 pgs.

"U.S. Appl. No. 12/849,787, Restriction Requirement mailed Oct. 4, 2012", 5 pgs.

"Application Serial No. PCT/US2011/051994, International Republished Application mailed Jun. 7, 2012", 1 pg.

"Application Serial No. PCT/US2011/052006, International Republished Application mailed Jun. 7, 2012", 1 pg.

"Application Serial No. PCT/US2011/052417, International Republished Application mailed Jun. 7, 2012", 1 pg.

"International Application Serial No. PCT/US2010/002166, International Preliminary Report on Patentability mailed Feb. 16, 2012", 6 pgs.

"International Application Serial No. PCT/US2011/051994, International Search Report mailed Apr. 16, 2012", 3 pgs.

"International Application Serial No. PCT/US2011/051994, Written Opinion mailed Apr. 16, 2012", 6 pgs.

"International Application Serial No. PCT/US2011/052006, Search Report mailed Apr. 16, 2012", 3 pgs.

"International Application Serial No. PCT/US2011/052006, Written Opinion mailed Apr. 16, 2012", 5 pgs.

"International Application Serial No. PCT/US2011/052059, Search Report mailed Apr. 20, 2012", 4 pgs.

"International Application Serial No. PCT/US2011/052059, Written Opinion mailed Apr. 20, 2012", 7 pgs.

"International Application Serial No. PCT/US2011/052060, International Search Report Apr. 20, 2012", 3 pgs.

"International Application Serial No. PCT/US2011/052060, Written Opinion mailed Apr. 20, 2012", 7 pgs.

"International Application Serial No. PCT/US2011/052061, International Search Report mailed Apr. 10, 2012", 3 pgs.

"International Application Serial No. PCT/US2011/052061, Written Opinion mailed Apr. 10, 2012", 4 pgs.

"International Application Serial No. PCT/US2011/052064, Search Report mailed Feb. 29, 2012", 3 pgs.

"International Application Serial No. PCT/US2011/052064, Written Opinion mailed Feb. 29, 2012", 3 pgs.

"International Application Serial No. PCT/US2011/052065, International Search Report mailed Apr. 10, 2012", 3 pgs.

"International Application Serial No. PCT/US2011/052065, Written Opinion mailed Apr. 10, 2012", 5 pgs.

"International Application Serial No. PCT/US2011/052369, International Search Report mailed Apr. 24, 2012", 6 pgs.

"International Application Serial No. PCT/US2011/052369, Written Opinion mailed Apr. 24, 2012", 3 pgs.

"International Application Serial No. PCT/US2011/052417, International Search Report mailed Apr. 23, 2012", 5 pgs.

"International Application Serial No. PCT/US2011/052417, Written Opinion mailed Apr. 23, 2012", 4 pgs.

Beyne, E, et al., "Through-silicon via and die stacking technologies for microsystems-integration", IEEE International Electron Devices Meeting, 2008. IEDM 2008., (Dec. 2008), 1-4.

Cabruja, Enric, et al., "Piezoresistive Accelerometers for MCM-Package-Part II", The Packaging Journal of Microelectromechanical Systems. vol. 14, No. 4, (Aug. 2005), 806-811.

Ezekwe, Chinwuba David, "Readout Techniques for High-Q Micromachined Vibratory Rate Gyroscopes", Electrical Engineering and Computer Sciences University of California at Berkeley, Technical Report No. UCB/EECS-2007-176, http://www.eecs.berkeley.edu/Pubs/TechRpts/2007/EECS-2007-176.html, (Dec. 21, 2007), 94 pgs.

Rimskog, Magnus, "Through Wafer Via Technology for MEMS and 3D Integration", 32nd IEEE/CPMT International Electronic Manufacturing Technology Symposium, 2007. IEMT '07., (2007), 286-289.

"U.S. Appl. No. 12/849,787, Non Final Office Action mailed May 28, 2013", 18 pgs.

"U.S. Appl. No. 12/849,787, Response filed Feb. 4, 2013 to Restriction Requirement mailed Oct. 4, 2012", 7 pgs.

"U.S. Appl. No. 12/849,787, Response filed Oct. 28, 2013 to Non Final Office Action mailed May 28, 2013", 12 pgs.

(56) References Cited

OTHER PUBLICATIONS

"U.S. Appl. No. 12/947,543, Notice of Allowance mailed Dec. 17, 2012", 11 pgs.
"U.S. Appl. No. 13/813,443, Preliminary Amendment mailed Jan. 31, 2013", 3 pgs.
"U.S. Appl. No. 13/821,586, Preliminary Amendment mailed Mar. 8, 2013", 6 pgs.
"U.S. Appl. No. 13/821,589, Preliminary Amendment mailed Mar. 8, 2013", 6 pgs.
"U.S. Appl. No. 13/821,598, Preliminary Amendment mailed Mar. 8, 2013", 7 pgs.
"U.S. Appl. No. 13/821,609, Preliminary Amendment mailed Mar. 8, 2013", 3 pgs.
"U.S. Appl. No. 13/821,612, Preliminary Amendment mailed Mar. 8, 2013", 3 pgs.
"U.S. Appl. No. 13/821,619, Preliminary Amendment mailed Mar. 8, 2013", 3 pgs.
"U.S. Appl. No. 13/821,793, Preliminary Amendment mailed Mar. 8, 2013", 3 pgs.
"U.S. Appl. No. 13/821,842, Preliminary Amendment mailed Mar. 8, 2013", 3 pgs.
"U.S. Appl. No. 13/821,853, Preliminary Amendment mailed Mar. 8, 2013", 3 pgs.
"Chinese Application Serial No. 201180053926.1, Amendment filed Aug. 21, 2013", w/English Translation, 13 pgs.
"Chinese Application Serial No. 201180055309.5, Voluntary Amendment filed Aug. 23, 2013", w/English Translation, 13 pgs.
"Chinese Application Serial No. 201320165465.3, Office Action mailed Jul. 22, 2013", w/English Translation, 2 pgs.
"Chinese Application Serial No. 201320165465.3, Response filed Aug. 7, 2013 to Office Action mailed Jul. 22, 2013", w/English Translation, 39 pgs.
"Chinese Application Serial No. 201320171504.0, Office Action mailed Jul. 22, 2013", w/English Translation, 3 pgs.
"Chinese Application Serial No. 201320171504.0, Response filed Jul. 25, 2013 to Office Action mailed Jul. 22, 2013", w/English Translation, 33 pgs.
"Chinese Application Serial No. 201320171616.6, Office Action mailed Jul. 10, 2013", w/English Translation, 2 pgs.
"Chinese Application Serial No. 201320171757.8, Office Action mailed Jul. 11, 2013", w/English Translation, 2 pgs.
"Chinese Application Serial No. 201320171757.8, Response filed Jul. 25, 2013 to Office Action mailed Jul. 11, 2013", w/English Translation, 21 pgs.
"Chinese Application Serial No. 201320171757.8, Response filed Jul. 26, 2013 to Office Action mailed Jul. 10, 2013", w/English Translation, 40 pgs.
"Chinese Application Serial No. 201320172128.7, Office Action mailed Jul. 12, 2013", w/English Translation, 3 pgs.
"Chinese Application Serial No. 201320172128.7, Response filed Aug. 7, 2013 to Office Action mailed Jul. 12, 2013", w/English Translation, 39 pgs.
"Chinese Application Serial No. 201320172366.8, Office Action mailed Jul. 9, 2013", w/English Translation, 3 pgs.
"Chinese Application Serial No. 201320172366.8, Response filed Sep. 16, 2013 to Office Action mailed Jul. 9, 2013", w/English Translation, 24 pgs.
"Chinese Application Serial No. 201320172367.2, Office Action mailed Jul. 9, 2013", w/English Translation, 2 pgs.
"Chinese Application Serial No. 201320172367.2, Response filed Sep. 16, 2013 to Office Action mailed Jul. 9, 2013", w/English Translation, 24 pgs.
"Chinese Application Serial No. 201320185461.1, Office Action mailed Jul. 23, 2013", w/English Translation, 3 pgs.
"Chinese Application Serial No. 201320185461.1, Response filed Sep. 10, 2013 to Office Action mailed Jul. 23, 2013", w/English Translation, 25 pgs.
"Chinese Application Serial No. 201320186292.3, Office Action mailed Jul. 19, 2013", w/English Translation, 2 pgs.
"Chinese Application Serial No. 201320186292.3, Response filed Sep. 10, 2013 to Office Action mailed Jul. 19, 2013", w/English Translation, 23 pgs.
"DigiSiMic™ Digital Silicon Microphone Pulse Part No. TC100E", TC100E Datasheet version 4.2 DigiSiMic™ Digital Silicon Microphone. (Jan. 2009), 6 pgs.
"EPCOS MEMS Microphone With TSV", (2005), 1 pg.
"European Application Serial No. 13001692.6, European Search Report mailed Jul. 24, 2013", 5 pgs.
"European Application Serial No. 13001696.7, Extended European Search Report mailed Aug. 6, 2013", 4 pgs.
"European Application Serial No. 13001721.3, European Search Report mailed Jul. 18, 2013", 9 pgs.
"International Application Serial No. PCT/US2011/051994, International Preliminary Report on Patentability mailed Mar. 28, 2013", 8 pgs.
"International Application Serial No. PCT/US2011/052006, International Preliminary Report on Patentability mailed Mar. 28, 2013", 7 pgs.
"International Application Serial No. PCT/US2011/052059, International Preliminary Report on Patentability mailed Jan. 22, 2013", 14 pgs.
"International Application Serial No. PCT/US2011/052060, International Preliminary Report on Patentability mailed Jan. 22, 2013", 12 pgs.
"International Application Serial No. PCT/US2011/052061, International Preliminary Report on Patentability mailed Mar. 28, 2013", 6 pgs.
"International Application Serial No. PCT/US2011/052064, International Preliminary Report on Patentability mailed Mar. 28, 2013", 5 pgs.
"International Application Serial No. PCT/US2011/052065, International Preliminary Report on Patentability mailed Mar. 28, 2013", 7 pgs.
"International Application Serial No. PCT/US2011/052340, International Preliminary Report on Patentability mailed Apr. 4, 2013", 5 pgs.
"International Application Serial No. PCT/US2011/052340, Search Report mailed Feb. 29, 2012", 3 pgs.
"International Application Serial No. PCT/US2011/052340, Written Opinion mailed Feb. 29, 2012", 3 pgs.
"International Application Serial No. PCT/US2011/052369, International Preliminary Report on Patentability mailed Apr. 4, 2013", 5 pgs.
"International Application Serial No. PCT/US2011/052417, International Preliminary Report on Patentability mailed Apr. 4, 2013", 6 pgs.
"International Application Serial No. PCT/US2013/021411, International Search Report mailed Apr. 30, 2013", 5 pgs.
"International Application Serial No. PCT/US2013/021411, Written Opinion mailed Apr. 30, 2013", 5 pgs.
"International Application Serial No. PCT/US2013/023877, International Search Report mailed May 14, 2013", 3 pgs.
"International Application Serial No. PCT/US2013/023877, Written Opinion mailed May 14, 2013", 5 pgs.
"International Application Serial No. PCT/US2013/024138, International Search Report mailed May 24, 2013", 3 pgs.
"International Application Serial No. PCT/US2013/024138, Written Opinion mailed May 24, 2013", 4 pgs.
"International Application Serial No. PCT/US2013/024149, Written Opinion mailed", 4 pages.
"International Application Serial No. PCT/US2013/024149, International Search Report mailed", 7 pages.
"Korean Application Serial No. 10-2013-7009775, Office Action mailed Sep. 17, 2013", w/English Translation, 6 pgs.
"Korean Application Serial No. 10-2013-7009777, Office Action mailed Sep. 17, 2013", w/English Translation, 8 pgs.
"Korean Application Serial No. 10-2013-7009788, Office Action mailed Aug. 29, 2013", w/English Translation, 6 pgs.
"Korean Application Serial No. 10-2013-7009790, Office Action mailed Jun. 26, 2013", W/English Translation, 7 pgs.

(56) References Cited

OTHER PUBLICATIONS

"Korean Application Serial No. 10-2013-7009790, Response filed Aug. 26, 2013 to Office Action mailed Jun. 26, 2013", w/English Claims, 11 pgs.
"Korean Application Serial No. 10-2013-7010143, Office Action mailed May 28, 2013", w/English Translation, 5 pgs.
"Korean Application Serial No. 10-2013-7010143, Response filed Jul. 24, 2013 to Office Action mailed May 28, 2013", w/English Claims, 14 pgs.
"T4020 & T4030 MEMS Microphones for Consumer Electronics", Product Brief 2010, Edition Feb. 2010, (2010), 2 pgs.
Acar, Cenk, et al., "Chapter 4: Mechanical Design of MEMS Gyroscopes", MEMS Vibratory Gyroscopes: Structural Approaches to Improve Robustness, Springer, (2009), 73-110.
Acar, Cenk, et al., "Chapter 6: Linear Multi DOF Architecture—Sections 6.4 and 6.5", MEMS Vibratory Gyroscopes: Structural Approaches to Improve Robustness, Springer, (2009), 158-178.
Acar, Cenk, et al., "Chapter 7: Torsional Multi-DOF Architecture", MEMS Vibratory Gyroscopes: Structural Approaches to Improve Robustness, Springer, (209), 187-206.
Acar, Cenk, et al., "Chapter 8: Distributed-Mass Architecture", MEMS Vibratory Gyroscopes: Structural Approaches to Improve Robustness, Springer, (2009), 207-224.
Acar, Cenk, et al., "Chapter 9: Conclusions and Future Trends", MEM Vibratory Gyroscopes: Structural Approaches to Improve Robustness, Springer, (2009), 225-245.
Ferreira, Antoine, et al., "A Survey of Modeling and Control Techniques for Micro- and Nanoelectromechanical Systems", IEEE Transactions on Systems, Man and Cybernetics—Part C: Applications and Reviews vol. 41, No. 3., (May 2011), 350-364.
Fleischer, Paul E, "Sensitivity Minimization in a Single Amplifier Biquad Circuit", IEEE Transactions on Circuits and Systems. vol. Cas-23, No. 1, (1976), 45-55.
Krishnamurthy, Rajesh, et al., "Drilling and Filling, but not in your Dentist's Chair A look at some recent history of multi-chip and through silicon via (TSV) technology", Chip Design Magazine, (Oct./Nov. 2008), 7 pgs.
Reljin, Branimir D, "Properties of SAB filters with the two-pole single-zero compensated operational amplifier", Circuit Theory and Applications: Letters to the Editor. vol. 10, (1982), 277-297.
Sedra, Adel, et al., "Chapter 8.9: Effect of Feedback on the Amplifier Poles", Microelectronic Circuits, 5th edition, (2004), 836-864.
Song-Hee, Cindy Paik, "A MEMS-Based Precision Operational Amplifier", Submitted to the Department of Electrical Engineering and Computer Sciences MIT, [Online]. Retrieved from the Internet: <URL: http://dspace.mit.edu/bitstream/handle/1721.1/16682/57138272.pdf? . . . >, (Jan. 1, 2004), 123 pgs.
Chinese Application Serial No. 201320172366.8, Office Action mailed Oct. 25, 2013, 8 pgs.
German Application Serial No. 102013014881.2, Office Action mailed Nov. 20, 2013, 1 pg.
Chinese Application Serial No. 201180053926.1, Office Action mailed Jan. 13, 2014, 7 pgs.
Chinese Application Serial No. 201180054796.3, Office Action mailed Jan. 16, 2014, 8 pgs.
Chinese Application Serial No. 201180055029.4, Office Action mailed Jan. 13, 2014, 7 pgs.
Chinese Application Serial No. 201320172366.8, Response filed Dec. 24, 2013 to Office Action mailed Oct. 25, 2013, 11 pgs.
Chinese Application Serial No. 201320565239.4, Office Action mailed Jan. 16, 2014, w/English Translation, 3 pgs.
European Application Serial No. 10806751.3, Extended European Search Report mailed Jan. 7, 2014, 7 pgs.
Korean Application Serial No. 10-2013-0109990, Amendment filed Dec. 10, 2013, 4 pgs.
Korean Application Serial No. 10-2013-7009775, Office Action mailed Dec. 27, 2013, 8 pgs.
Korean Application Serial No. 10-2013-7009777, Office Action mailed Jan. 27, 2014, 5 pgs.
Korean Application Serial No. 10-2013-7009788, Office Action mailed Dec. 27, 2013, w/English Translation, 10 pgs.
U.S. Appl. No. 12/849,787, Notice of Allowance mailed Dec. 11, 2013, 9 pgs.
U.S. Appl. No. 13/362,955, Response filed Feb. 17, 2014 to Restriction Requirement mailed Dec. 17, 2013, 9 pgs.
U.S. Appl. No. 13/362,955, Restriction Requirement mailed Dec. 17, 2013, 6 pgs.
U.S. Appl. No. 13/363,537, Non Final Office Action mailed Feb. 6, 2014, 10 pgs.
U.S. Appl. No. 13/742,942, Notice of Allowance mailed Jan. 28, 2014, 9 pgs.
U.S. Appl. No. 13/746,016, Notice of Allowance mailed Jan. 17, 2014, 10 pgs.
U.S. Appl. No. 13/755,841, Restriction Requirement mailed Feb. 21, 2014, 6 pgs.
Chinese Application Serial No. 201180055309.5, Office Action mailed Mar. 31, 2014, with English translation of claims, 7 pgs.
Chinese Application Serial No. 201320172366.8, Office Action mailed Jan. 30, 2014, with English translation of claims, 3 pgs.
Chinese Application Serial No. 201320172366.8, Response filed Mar. 18, 2014 to Office Action mailed Jan. 30, 2014, with English translation of claims, 20 pgs.
Chinese Application Serial No. 201320565239.4, Response filed Mar. 31, 2014 to Office Action mailed Jan. 16, 2014, with English translation of claims, 38 pgs.
European Application Serial No. 118260070.2, Office Action mailed Mar. 12, 2014, 1 pg.
European Application Serial No. 11826070.2, Extended European Search Report mailed Feb. 21, 2014, 5 pgs.
European Application Serial No. 118260710.0, Extended European Search Report mailed Feb. 20, 2014, 6 pgs.
European Application Serial No. 11820671.0, Office Action mailed Mar. 12, 2014, 1 pg.
European Application Serial No. 13001692.63, Response filed Apr. 1, 2014, 19 pgs.

* cited by examiner

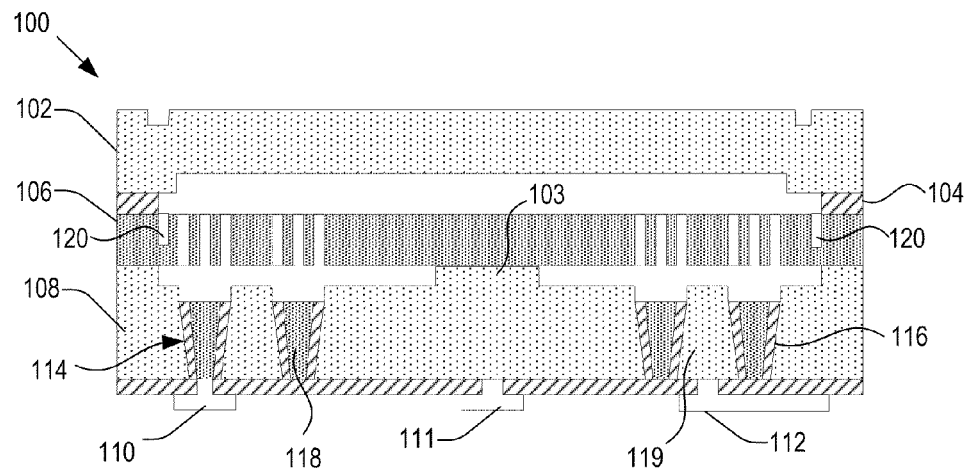
FIG. 1
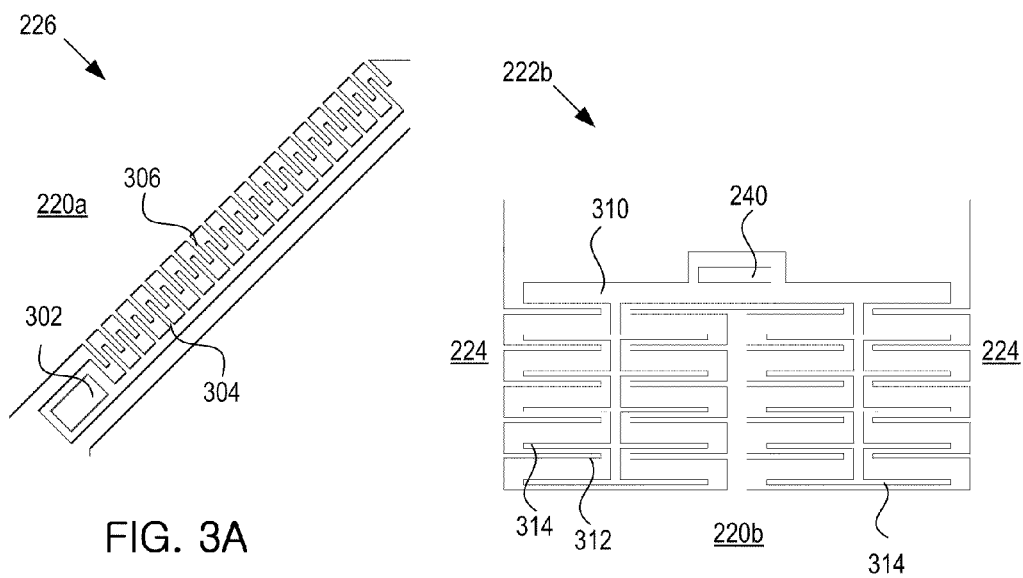
FIG. 3A
FIG. 3B

MICROMACHINED INERTIAL SENSOR DEVICES

CROSS REFERENCE TO RELATED APPLICATIONS

This application claims the benefit of U.S. Provisional Applications No. 61/273,538, entitled "Performance enhancements and fabrication method of micromachined integrated 6-axis inertial measurement device," filed on Aug. 4, 2009, and 61/273,494, entitled "Micromachined inertial sensor devices and methods for making same," filed on Aug. 4, 2009, which are hereby incorporated herein by reference in their entirety.

BACKGROUND OF THE INVENTION

The present invention generally relates to inertial sensor devices and, more particularly, to micromachined inertial sensor devices.

With the rapid advance of modern electronic technology, various electronic devices, such as navigation systems, cell phones, and electronic games, require sensors that can accurately determine motions of the devices at low cost with small form factor. Conventional techniques have been developed to bump micro-electromechanical-systems (MEMS) chips on ASIC wafers or integrate MEMS with ASIC wafers. However, majority of the existing MEMS sensors measure either acceleration or rotation, but not the 6 degrees-of-freedom (three independent accelerations and three independent rotations) of an object. As such, the existing ASIC wafers for detecting the motion of an object in 6 DOF have large form factors to accommodate multiple MEMS sensors and extra circuits or algorithms to handle the data received from the multiple sensors. Furthermore, fabrication of multiple MEMS and packaging/integration of MEMS with ASIC wafers increase the manufacturing cost of the sensor devices. Thus, there is a need for a single MEMS device that can detect the motion of an object in 6 DOF so that the overall form factor and manufacturing cost of a sensor device that contains the MEMS can be significantly reduced.

SUMMARY OF THE INVENTION

In one embodiment of the present disclosure, a sensor for measuring a motion includes a frame; a first planar proof mass section attached to the frame by a first flexure; and a second planar proof mass section attached to the frame by a second flexure. The frame, the first planar proof mass section, and the second planar proof mass section are formed in a micromachined layer and are adapted to measure angular rates about three axes and linear accelerations about the three axes.

In another embodiment of the present disclosure, a device for measuring a motion includes a first wafer, a device layer, and a second wafer, where the first and second wafers are bonded to the device layer to thereby encapsulate the device layer. The device layer includes a frame; a first planar proof mass section attached to the frame by a first flexure; and a second planar proof mass section attached to the frame by a second flexure. The frame, the first planar proof mass section, and the second planar proof mass section are formed in a micromachined layer and are adapted to measure angular rates about three axes and linear accelerations about the three axes.

These and other features, aspects and advantages of the present invention will become better understood with reference to the following drawings, description and claims.

BRIEF DESCRIPTION OF THE DRAWINGS

FIG. 1 shows a schematic cross sectional view of a multi-DOF device in accordance with one embodiment of the present invention;

FIG. 3A shows an enlarged view of a comb drive electrode of the sensor in FIG. 2;

FIG. 3B shows an enlarged view of a y-axis accelerometer electrode of the sensor in FIG. 2;

DETAILED DESCRIPTION OF THE INVENTION

Figure 2:
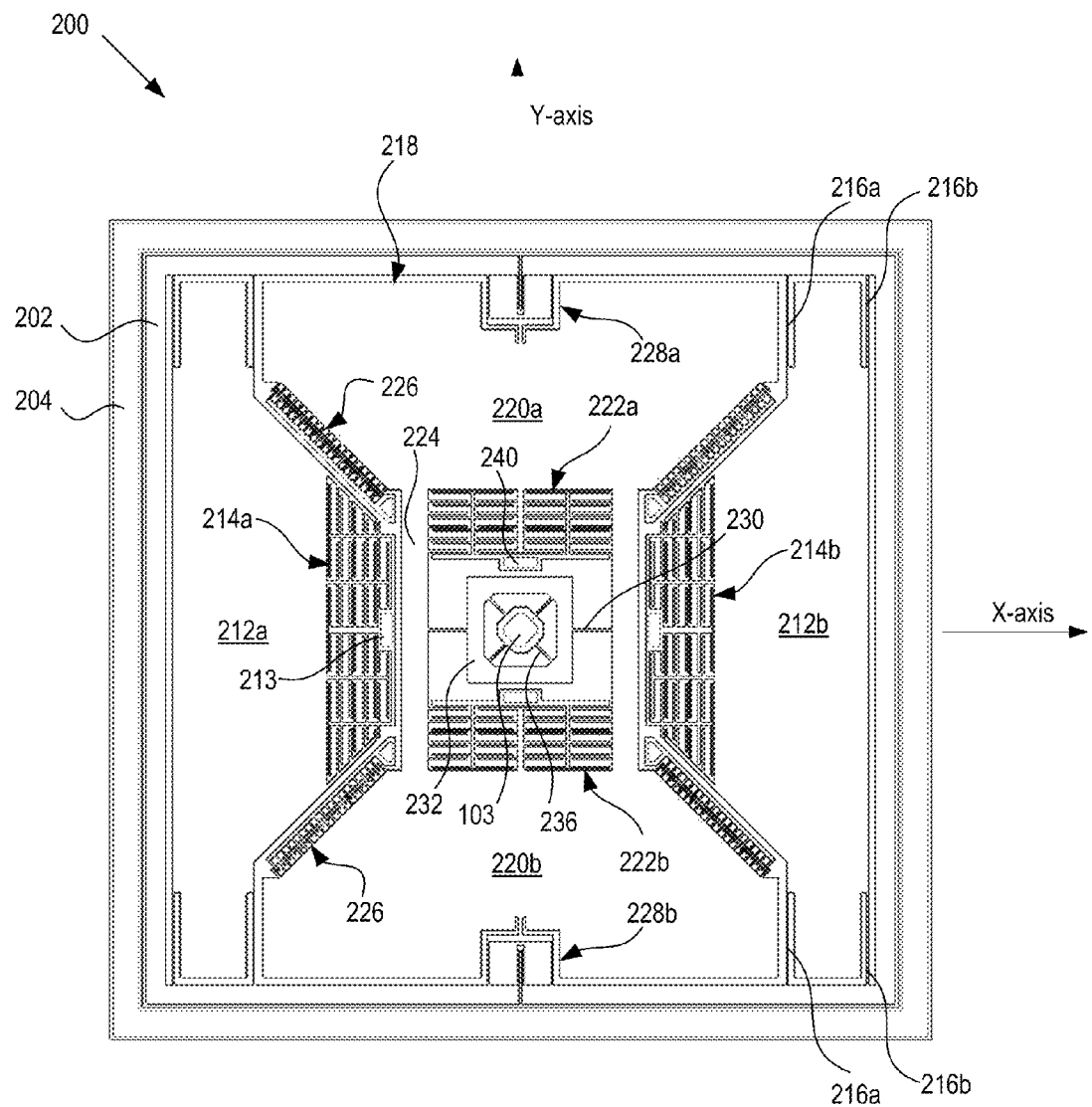
FIG. 2 shows a schematic top view of a sensor of the multi-DOF device in FIG. 1.

The following detailed description is of the best currently contemplated modes of carrying out the invention. The description is not to be taken in a limiting sense, but is made merely for the purpose of illustrating the general principles of the invention because the scope of the invention is best defined by the appended claims.

FIG. 1 shows a schematic cross sectional view of a multi-DOF device 100. As depicted, the multi-DOF device 100 includes a cap wafer 102; a device layer (or, equivalently, MEMS layer or micromachined structure layer) 106 that includes micromachined structures (or, MEMS structures); and a via wafer 108. The cap wafer 102 may be metal bonded to the device layer 106, where the metal bonding 104 can generate thermal stress between the cap wafer 102 and the device layer 106 during operation. To isolate the micromachined structures from the thermal stress, a stress reducing groove 120 can be formed around the perimeter of the device layer 106. The metal bond 104 may be a non-high temperature fusion bond and enable the application of getter to maintain a long term vacuum and application of an anti-stiction coating to prevent stiction that could occur to low-g acceleration sensors. The via wafer 108 may be fusion bonded, such as silicon-silicon fusion bonded, to the device layer 106, obviating thermal stress between the via wafer 108 and the device layer 106.

The via wafer 108 may include a protruding portion (or, equivalently, anchor) 103 that is located substantially at the center of the via wafer 108 and provides an anchoring (attaching) structure for the device layer 106. The anchor 103 may be fusion bonded to the device layer 106, to thereby eliminate potential problems associated with metal fatigue.

Sensors formed in the device layer 106 measure changes in capacitance to detect angular displacements. As such, any external electric or magnetic field may affect the accuracy in the measurement of the angular displacements. To shield the external electric and magnetic fields, the device layer 106 and the cap wafer 102 are electrically connected to each other and preferably grounded.

The via wafer 108 includes multiple regions separated by an isolating trenches (or, equivalently, vias) 114. Each via 114 is filled with conductive non-crystalline material 118, such as polysilicon or metal. The conductive material 118 is electrically insulated by dielectric material 116, and can be electrically biased to the voltage at the electrode, to create a zero voltage differential and thereby to eliminate the shunt capacitance of the via.

Each of the regions separated by the isolating trenches 114 has an electrical contact for data communication. For example, as depicted in FIG. 1C, the via wafer 108 may include three contacts 110, 111, and 112 that may be connected to an ASIC wafer by bumps or wire-bonds. In another example, the contact 110 may be an electrode contact that is connected to the via 114, while the contact 111 may be an anchor contact electrically connected to the anchor 103, and the contact 112 is a circular via contact electrically connected to an isolated region (or, island) 119. Detailed description of the vias and isolated regions is disclosed in a copending U.S. patent application Ser. No. 12/849,787, entitled "Micromachined devices and fabricating the same," filed on Aug. 3, 2010, which is hereby incorporate herein by reference in its entirety.

The device layer 106 may include a micromachined structure that functions as gyroscopes and acceleration sensors. Electrical connections to the micromachined structure is achieved through anchors 103 and by capacitive coupling between isolated regions of the via wafer 108 and the device layer 106. Detailed description of the micromachined structure operation is given below in conjunction with FIGS. 4A-5B FIG. 2 shows a schematic top view of a micromachined integrated 6-axis inertial measurement device (or, equivalently, micromachined device or sensor) 200 that is included in the device layer (or micromachined layer) 106 in FIG. 1. As depicted, the sensor 200 includes a seal frame 204 that is bonded to the via frame 108 and the cap frame 102; a proof-mass outer frame 202; a pair of x-axis planar proof mass sections (or, shortly, x-axis proof mass sections) 212a and 212b; and a y-axis planar proof mass section (or shortly, y-axis proof mass section) 218. Each of the x-axis proof mass sections 212a and 212b is attached/suspended to the proof-mass outer frame 202 by two pairs of z-axis gyroscope flexures 216a and 216b, and includes an x-axis accelerometer/z-axis gyroscope electrode 214a (or 214b). Each of the pair of x-axis proof mass sections 212a and 212b and the y-axis proof mass section 218 is formed in a substantially plate. Each of the z-axis gyroscope flexures 216a and 216b has a uniform bar or beam shape.

The y-axis proof mass section 218 includes two wing portions 220a and 220b that are connected with the elongated portions 224 that form an integral body. The y-axis proof mass section 218 is attached to the frame 202 by a pair of x-axis gyroscope flexures 228a and 228b, where the flexures are described in conjunction with FIG. 7. The elongated portions 224 are attached to a drive decoupling frame 232 via two y-axis gyroscope flexures 230. The wing portion 220a (or 220b) includes a y-axis electrode 222a (or 222b) and comb drive electrodes 226. As discussed below, the proof-mass outer frame 202, the pair of planar x-axis proof mass sections 212a and 212b, and the y-axis proof mass section 218 are driven simultaneously during a driving operational mode. As such, hereinafter, the term "a single proof-mass" collectively refers to the proof-mass outer frame 202, the pair of x-axis proof mass sections 212a and 212b; and the y-axis proof mass section 218.

The sensor 200 also includes an anchor 103 that is disposed substantially at the center of the sensor and affixed to the via wafer 108. The drive decoupling frame 232 is connected to the anchor 103 by four drive suspension beams 236.

FIG. 3A shows an enlarged view of the comb drive electrode 226 of the sensor 200 in FIG. 2, where the comb drive electrode 226 is used to drive the x-axis and y-axis proof mass sections to oscillate at a single drive frequency about the z-axis. As depicted, the comb electrode 226 includes stationary fingers 304 connected to an anchor 302 and moving comb fingers 306 connected to 220a. The anchor 302 is affixed to the via wafer 108, causing the stationary fingers 304 to be fixed in space during operation. The anchor 302 may have any suitable polygonal shape, such as rectangle, triangle, and pentagon. The moving fingers 306, which interdigitate with the stationary fingers 304. During operation, electrical signals at the drive frequency are applied to the stationary fingers 304 via the anchor 302. Then, due to the interaction between the stationary fingers 304 and the moving comb fingers 306, the y-axis proof mass section 218 and the x-axis proof mass sections 212a and 212b oscillate at the drive frequency, as discussed below in conjunction with FIG. 4A.

FIG. 3B shows an enlarged view of the y-axis accelerometer electrode (or, equivalently, y-axis acceleration transducer or y-axis accelerometer comb fingers) 222b of the sensor 200 in FIG. 2, where the y-axis accelerometer electrode 222b monitors the motions of the y-axis proof mass section 218 in response to y-axis acceleration. As depicted, the y-axis accelerometer electrode 222b includes a plurality of spaced apart, parallel input electrodes or plates 312 and corresponding number of stationary electrodes or plates 314 that interdigitate with the input plates 312. The stationary plates 314 extend from a stator 310 that is secured to an anchor 240, while the input plates 312 extend from the elongated portions 224 of the y-axis proof mass section 218. When the y-axis proof mass section 218 moves relative to the stationary plates 314, the electrical interaction (or, capacitance) between the stationary plates 314 and the input plates 312 changes. The change in capacitance is monitored to measure the motion of the y-axis proof mass section 218.

The x-axis accelerometer electrodes (or, equivalently, x-axis acceleration transducers or x-axis accelerometer comb fingers) 214a and 214b have the similar structure as the y-axis electrode 222b. As such, for brevity, the detailed description of the x-axis electrodes 214a and 214b are not repeated. For instance, the x-axis accelerometer electrode 214a includes a plurality of spaced apart, parallel input electrodes or plates and corresponding number of stationary electrodes or plates that interdigitate with the input plates. The stationary plates are connected to the anchor 213, while the input electrodes extend from the x-axis proof mass section 212a.

Figure 4A:
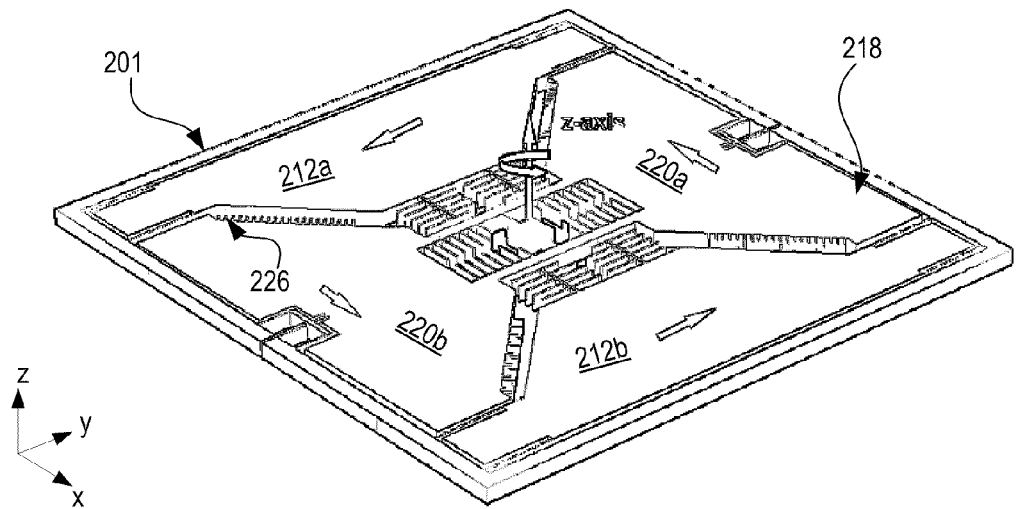
FIG. 4A shows the single mass in FIG. 2 under a gyroscope drive operational mode.
Figure 4B:
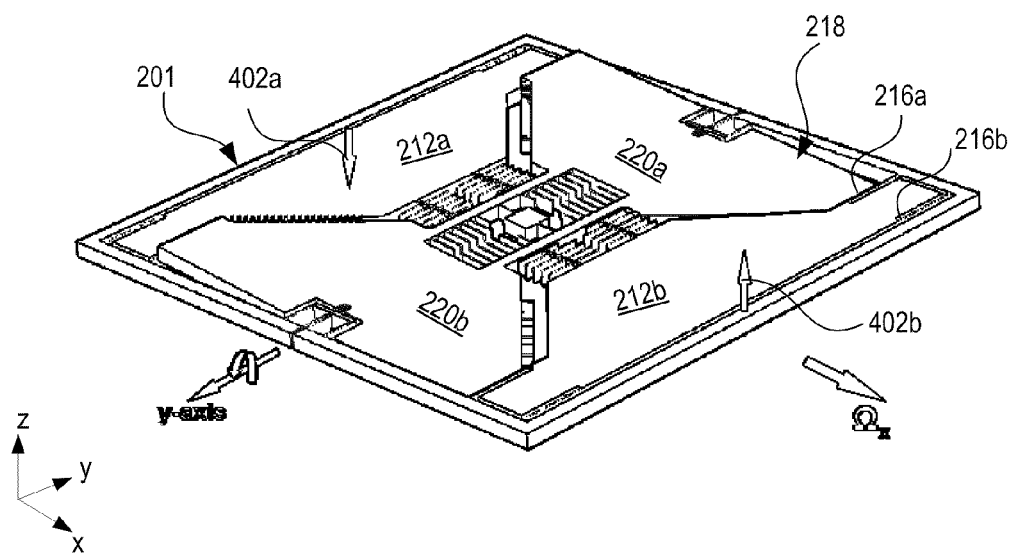
FIG. 4B shows the single mass in FIG. 2 during the sense motion in response to rotation about the x-axis.
Figure 4C:
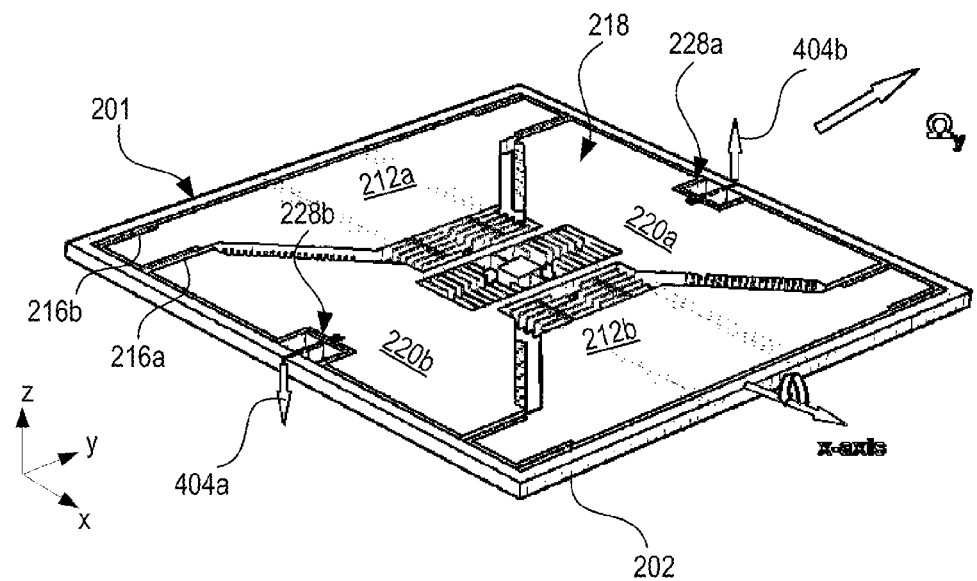
FIG. 4C shows the single mass in FIG. 2 during the sense motion in response to rotation about the y-axis.
Figure 4D:
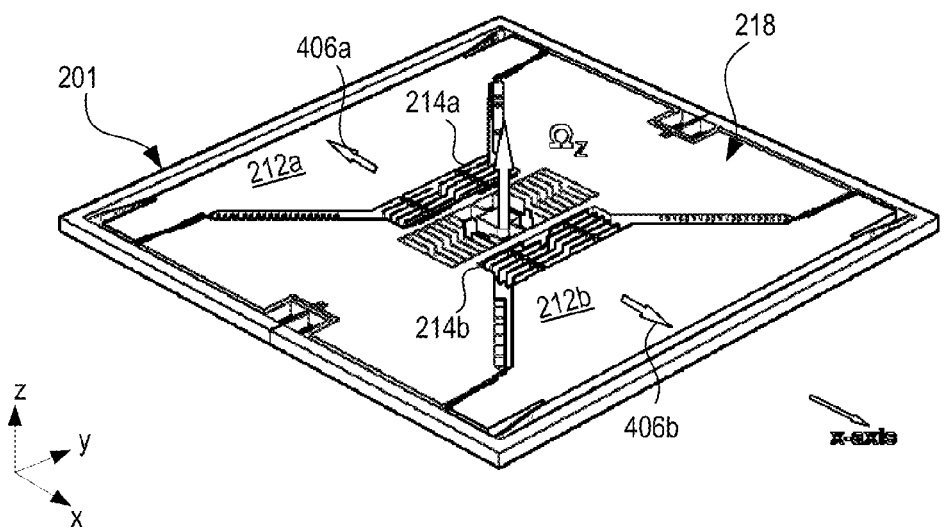
FIG. 4D shows the single mass in FIG. 2 during the sense motion in response to rotation about the z-axis.

The x-axis accelerometer electrodes 214a and 214b can be used to measure rotational motions about the z-axis, as described in conjunction with FIG. 4D. Optionally, a separate z-axis gyro electrodes may be formed in the area where the x-axis accelerometer electrodes are disposed.

FIG. 4A shows the single proof-mass 201 under the gyroscope drive operational mode, where the single proof-mass collectively refers to the proof-mass outer frame 202, the pair of planar x-axis proof mass sections 212a and 212b, and the y-axis proof mass section 218. As depicted, the comb drive electrodes 226 are driven to make the wing portions 220a and 220b of the y-axis proof mass section 218 oscillate in an anti-phase fashion along the X and Y directions respectively, resulting in torsional motions (or rotations) of the single proof-mass 201 with respect to the z-axis at a preset drive frequency. The torsional motions cause the drive suspension beams 236 (shown in FIG. 2) to bend in a flexible manner, to thereby provide restoring torques to the x-axis and y-axis proof mass sections.

FIG. 4B shows the single proof-mass 201 during the sense motion in response to rotation about the x-axis. As discussed above with reference to FIG. 4A, x-axis proof mass sections 212a and 212b are driven to oscillate about the z-axis by exciting the comb drive electrodes 226 at a preset drive frequency. When the x-axis proof mass sections 212a and 212b are rotated at an angular rate about the x-axis, i.e., the single proof-mass 201 is externally disturbed at an angular rate of $\Omega x$, an out-of-plane Coriolis force is generated for the single proof-mass 201 by the combination of the driving oscillation and the rotation at $\Omega x$. The Coriolis force causes the single proof-mass 201 to be torsionally excited about the y-axis. Also, as the x-axis proof mass sections 212a and 212b are suspended to the proof-mass outer frame 202 via the z-axis gyroscope flexures 216a and 216b, the Coriolis force causes the x-axis proof mass sections 212a and 212b to move in opposite directions, as indicated by arrows 402a and 402b.

Figure 6:
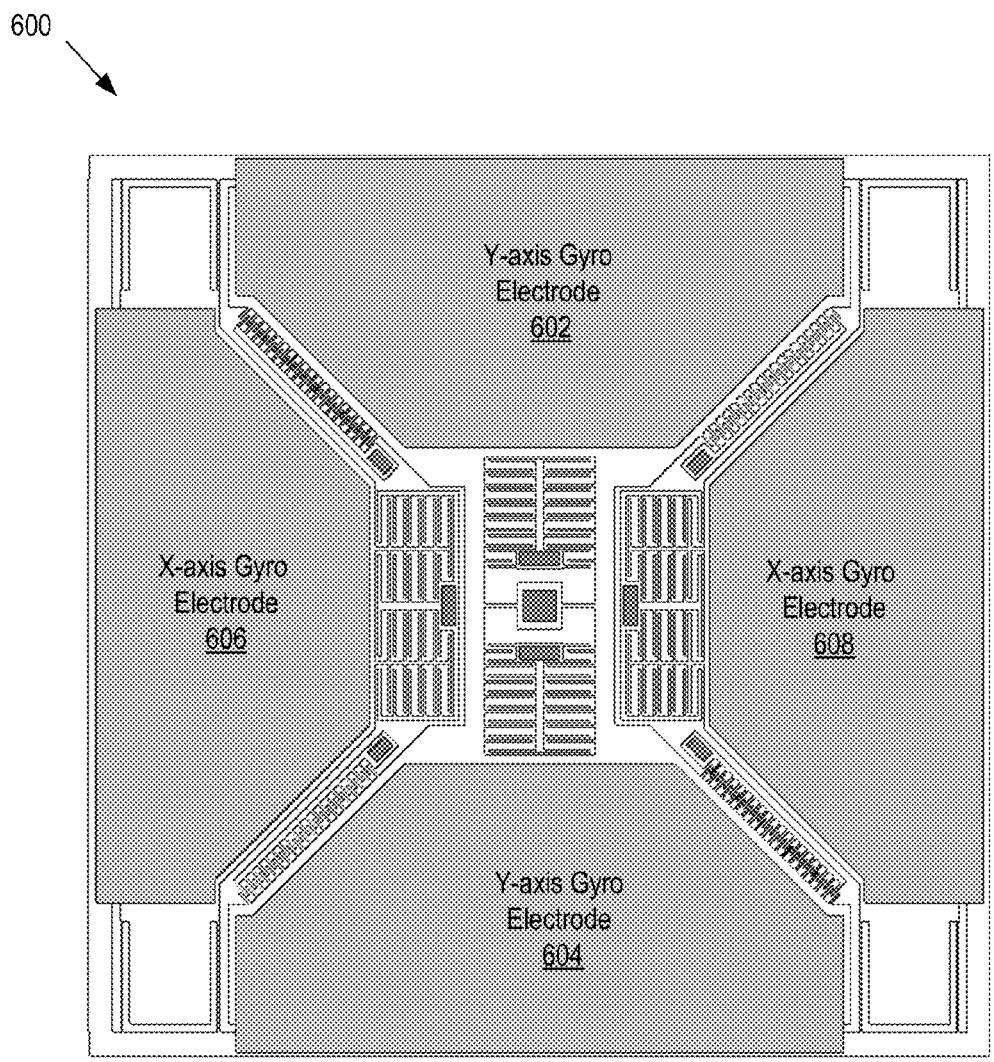
FIG. 6 shows a schematic top view of gyro electrodes underneath the device layer for measuring out-of-plane motions of the sensor in FIG. 2.

The motion of the x-axis proof mass sections 212a and 212b can be detected by x-axis gyro electrodes 606 and 608 (shown in FIG. 6). More specifically, the variation of the capacitance between the x-axis gyro electrodes 606 and 608 and the corresponding x-axis proof mass sections 212a and 212b are measured to detect the Coriolis force, to thereby measure the angular rate $\Omega x$ of the single proof-mass 201.

FIG. 4C shows the single proof-mass 201 during the sense motion in response to rotation about the y-axis. As discussed above with reference to FIG. 4A, the y-axis proof mass section 218 is driven to oscillate about the z-axis by exciting the comb drive electrodes 226 at a preset drive frequency. When the single proof-mass 201 is rotated at an angular rate about the y-axis, i.e., the single proof-mass 201 is externally disturbed at an angular rate of $\Omega y$, an out-of-plane Coriolis force is generated for the y-axis proof mass section 218 by the combination of the drive oscillation and rotation at $\Omega y$. The Coriolis force causes the single proof-mass 201 to be torsionally excited about the x-axis. Also, as the y-axis proof mass section 218 is connected to the drive decoupling frame 232 (shown in FIG. 2) via the y-axis gyroscope flexures 230, the Coriolis force causes the y-axis gyroscope flexures 230 to rotate about the x-axis, as indicated by arrows 404a and 404b. The y-axis gyroscope flexures 230 provide a restoring torque to the y-axis proof mass section 218.

The motion of the y-axis proof mass section 218 can be detected by y-axis gyro electrodes 602 and 604 (shown in FIG. 6). More specifically, the variation of the capacitance between the y-axis gyro electrodes 602 and 604 and the corresponding wing portions 220a and 220b of the y-axis proof mass section 218 are measured to detect the Coriolis force, to thereby measure the angular rate $\Omega y$ of the single proof-mass 201.

FIG. 4D shows the single proof-mass 201 during the sense motion in response to rotation about the z-axis. When the x-axis proof mass sections 212a and 212b are subject to an angular rate about the z-axis, at an angular rate of $\Omega z$, the opposite velocities of the x-axis proof mass sections 212a and 212b induce opposing in-plane Coriolis forces in the x-direction, as indicated by arrows 406a and 406b. The x-axis proof mass section 212a and the x-axis proof mass section 212b oscillate in an anti-phase fashion in the x-direction due to the opposite directions of Coriolis forces. The motions of the x-axis proof mass sections 212a and 212b can be detected by the x-axis accelerometer electrodes 214a and 214b, or separate similar electrodes disposed in the same area.

Figure 5A:
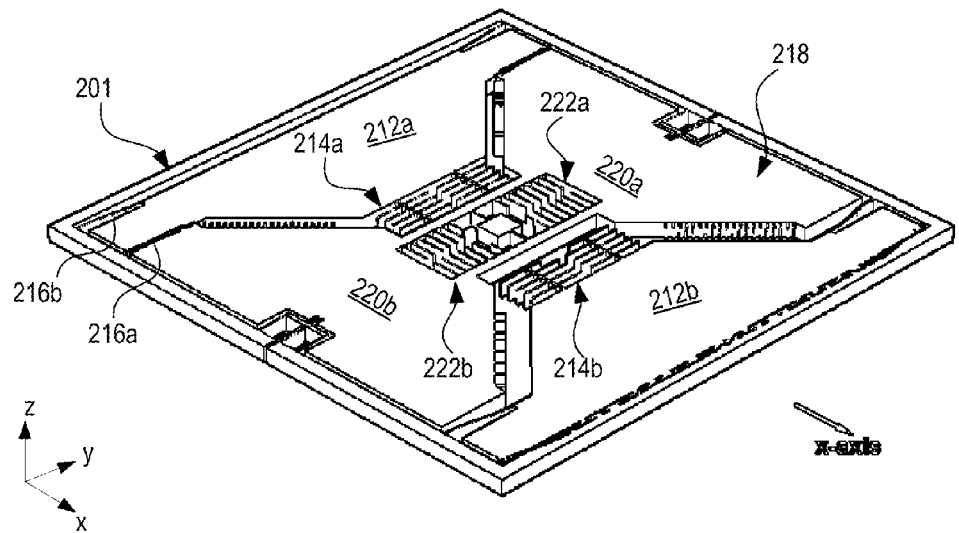
FIGS. 5A and 5B show the single mass under linear accelerations in the x and z directions, respectively.

FIG. 5A shows the single proof-mass 201 under linear acceleration in the x direction. When the x-axis proof mass sections 212a and 212b are accelerated along the x-direction, the x-axis proof mass sections 212a and 212b move in-phase along the x-axis. The z-axis gyroscope flexures 216a and 216b deform under the linear acceleration along the x-direction. The variation of the capacitance of the x-axis accelerometer electrodes 214a and 214b are measured to detect the motions of the x-axis proof mass sections 212a and 212b. The x-axis accelerometer electrodes 214a and 214b can measure the acceleration in the x-direction as well as the angular rate in the z-direction.

The linear acceleration of the single proof-mass 201 along the y-direction is measured by the similar manner as the linear acceleration along the x-direction is measured. The motion of the y-axis proof mass section 218 is detected by measuring variation of the capacitance of the y-axis accelerometer electrodes (or, y-axis comb finger sensors) 222a and 222b. The y-axis accelerometer electrodes 222a and 222b can be dedicated to measure accelerations in the y-axis direction. The x-axis gyroscope flexures 228a and 228b deform under linear acceleration in the y-axis direction.

Figure 5B:
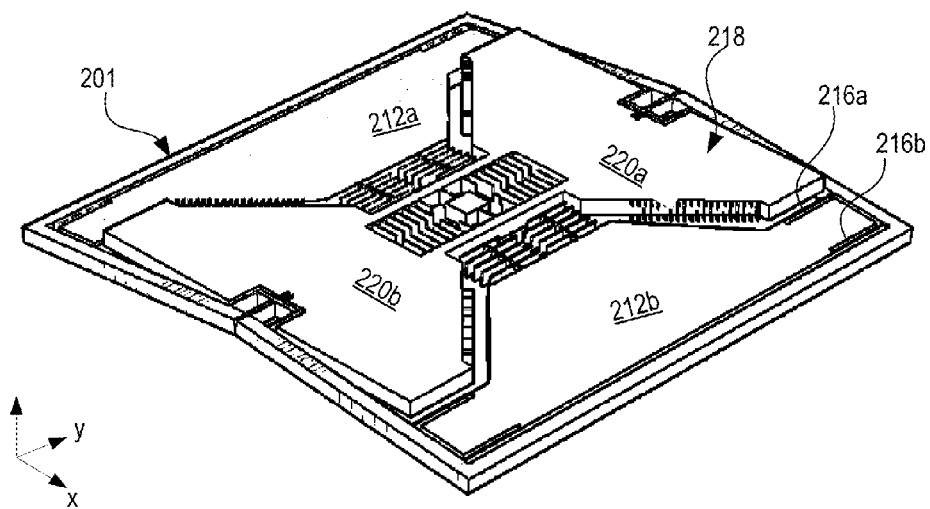

FIG. 5B shows the single proof-mass 201 under linear acceleration in the z-direction. Each of the x-axis proof mass sections 212a and 212b is suspended to the proof-mass outer frame 202 via two z-axis gyroscope flexures 216a and 216b, while the proof mass outer frame 202 is suspended to the y-axis proof mass section 218 by x-axis gyroscope flexures 228a and 228b. Thus, when the single proof-mass 201 is accelerated along the z-direction, the x-axis proof mass sections 212a and 212b move in-phase in the z-direction, while the y-axis proof mass section 218 stays still. Accordingly, the motion or acceleration of the x-axis proof mass sections 212a and 212b can be measured by the x-axis gyroscope electrodes 606 and 608 (shown in FIG. 6). In an alternative embodiment, a dedicated z-axis electrode (not shown in FIG. 5B) can be included in the sensor 200 so that the acceleration in the z-direction can be measured without using the x-axis gyroscope electrodes 606 and 608.

FIG. 6 shows a schematic top view of gyro electrodes 600 for measuring motions of the sensor. As depicted, the gyro electrodes 600 include x-axis gyro electrodes 606 and 608 and y-axis gyro electrodes 602 and 604. As discussed above, the variation of the capacitance between each of the gyro electrodes 600 and the corresponding component of the sensor 200 is used to measure the motion of the sensor. The gyro electrodes 600 may be mounted on the surface of the via wafer 108 (shown in FIG. 1) or within the via layer, and spaced apart from the sensor 200 by a predetermined distance.

Figure 7:
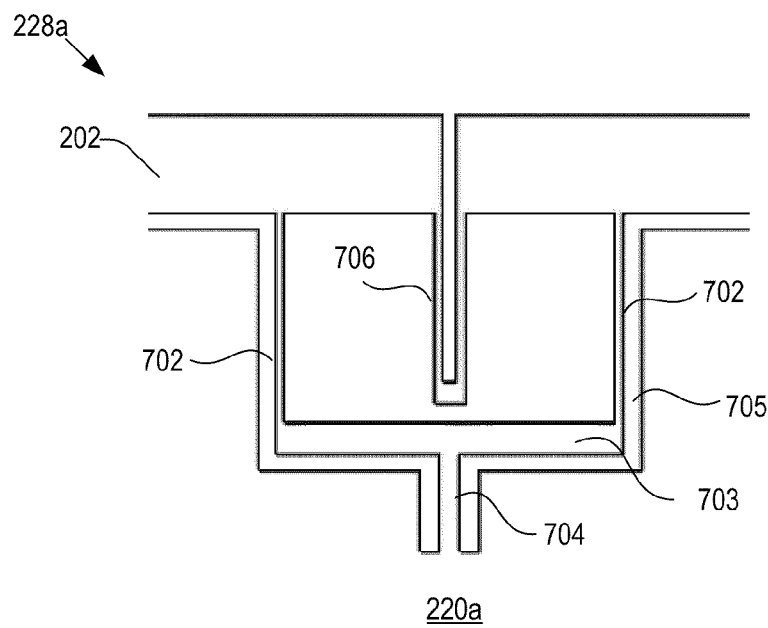
FIG. 7 shows an enlarged view of the flexure structure that allows x-axis gyro sense and z-axis accelerometer sense motions.

FIG. 7 shows an enlarged view of the flexure structure 228a that allows x-axis gyro sense and z-axis accelerometer sense motions. The flexure comprises an x-axis gyro spring 704, a z-axis accelerometer spring 702 and a frame connection spring 706. As depicted, the wing portion 220a of the y-axis proof mass section 218 is connected to the proof-mass outer frame 202 via the beam 704 and the x-axis gyro spring 704, where one end of the spring 704 is attached to the wing portion 220a and the other end of the spring 704 is attached to the outer frame 202 via a linkage 703 and the z-axis accelerometer spring 702. The linkage 703 and the z-axis accelerometer spring 702 are separated from the wing portion 220a by grooves (or gaps) 705. The gaps 705 are large enough to permit the linkage 703, the x-axis gyro spring 704 and the z-axis accelerometer spring 702 to move through its design range without colliding with the wing portion 220a.

The x-axis gyro spring 704 provides a restoring torque about the y-axis when the x-axis proof mass sections 212a and 212b are torsionally excited about the y-axis, as shown in FIG. 4B. The z-axis accelerometer spring 702 acts as a torsional hinge and provides a restoring torque about the y-axis when the y-axis proof mass section 218 is accelerated along the z-axis, as shown in FIG. 5B.

Figure 8:
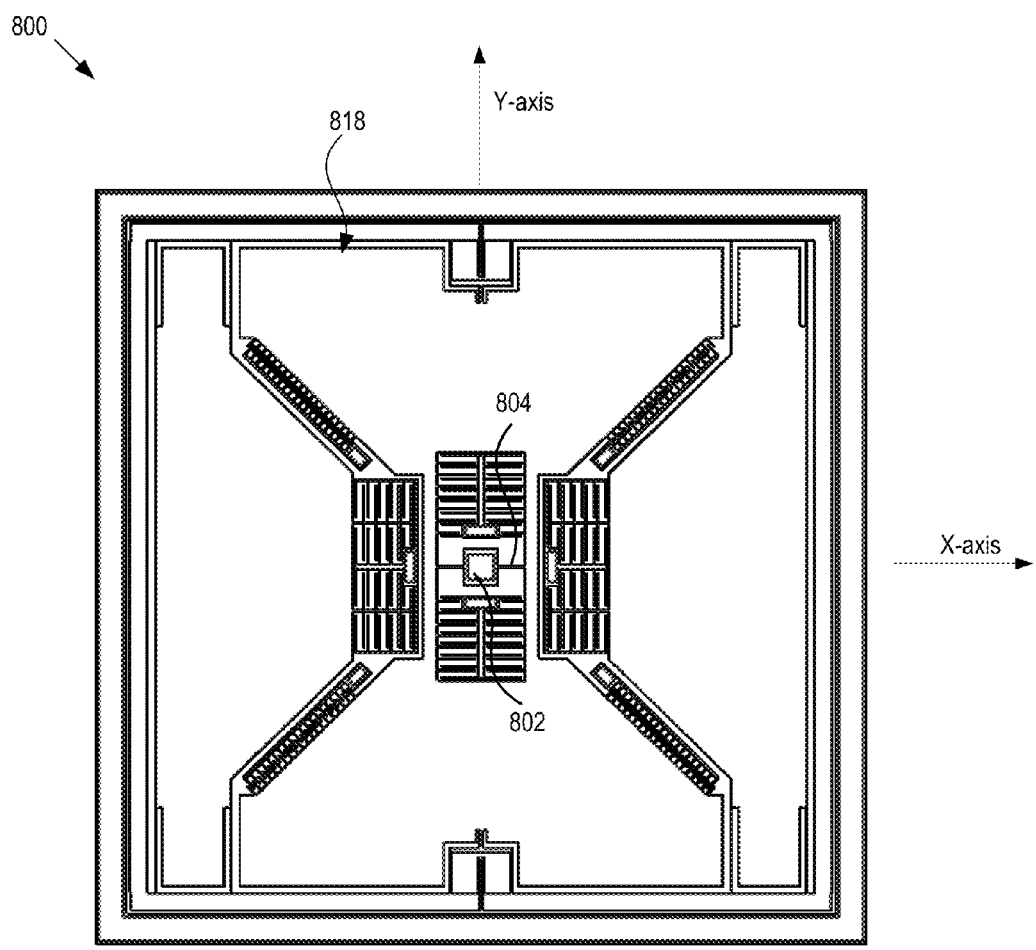
FIG. 8 shows a schematic top view of another embodiment of a sensor in accordance with the present invention.

FIG. 8 shows a schematic top view of another embodiment of a sensor 800 in accordance with the present invention, where the sensor 800 has similar functions as the sensor 200 (shown in FIG. 2). As depicted, the sensor 800 is similar to the sensor 200 in FIG. 2, with the difference that the sensor 800 does not include the drive decoupling frame 232, i.e., y-axis gyroscope flexures (or beams) 804 connect the y-axis proof mass section 818 directly to the anchor 802. In this embodiment, the y-axis gyroscope beams 804 can be utilized as drive suspension beams as well. In the y-axis angular rate response mode (which is similar to the mode described in FIG. 4C), the y-axis gyroscope beams 804 are twisted about the x-axis, to thereby act as torsional hinges about the x-axis. In the drive mode, the y-axis gyroscope beams 804 deflect as fixed-guided end beams, allowing the y-axis proof mass section 818 to rotate about the z-axis. It is noted that the sensor 800 does not include a drive decoupling frame to reduce the complexity of the suspension mechanism for the proof mass.

Figure 9B:
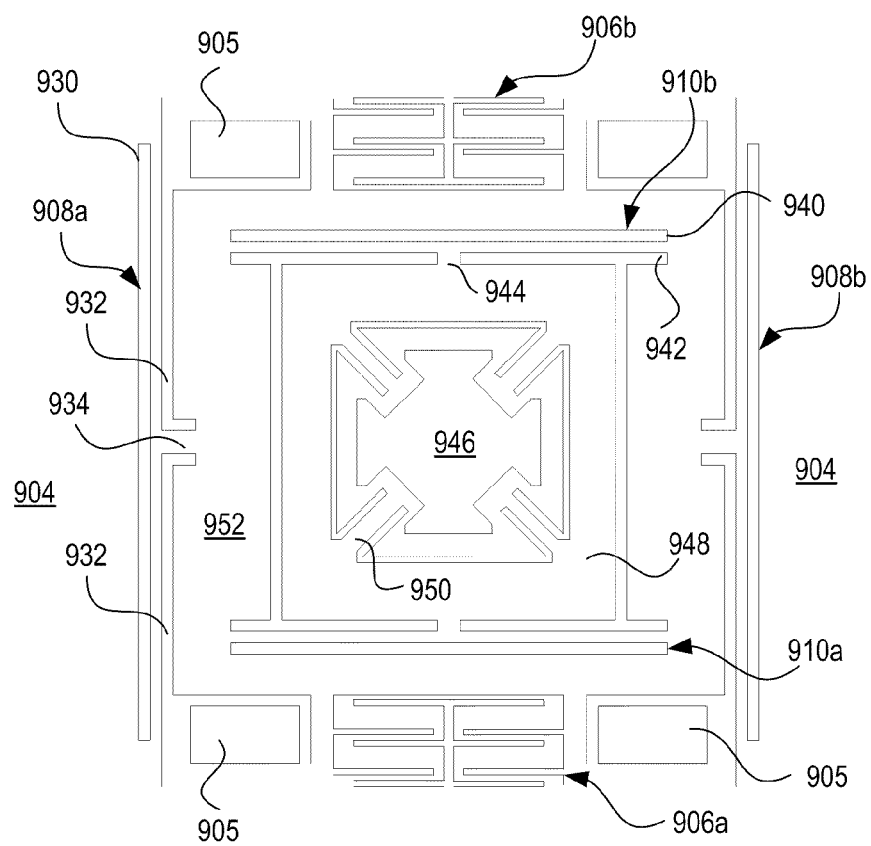
FIG. 9B shows an enlarged view of the flexure structures of the sensor in FIG. 9A.
Figure 9A:
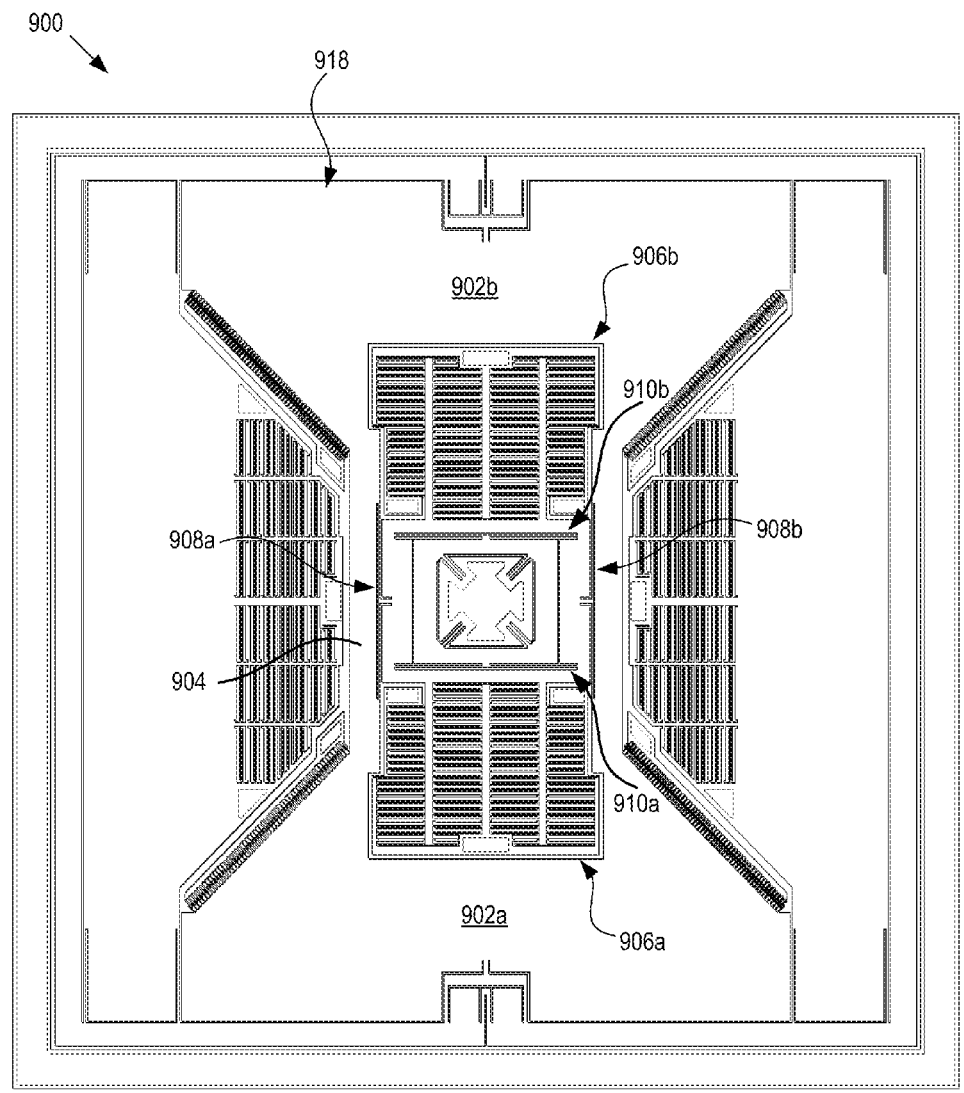
FIG. 9A shows a schematic top view of yet another embodiment of a sensor in accordance with the present invention.

FIG. 9A shows a schematic top view of yet another embodiment of a sensor 900 in accordance with the present invention. FIG. 9B shows an enlarged view of the x-axis and y-axis accelerometer flexures of the sensor 900 in FIG. 9A. As depicted, the sensor 900 is similar to the sensor 200 in FIG. 2, with the difference that the sensor 900 includes x-axis accelerometer fixtures 908a, 908b and y-axis accelerometer flexures 910a, 910b. The sensor 900 includes a y-axis proof mass section 918 having a pair of wing portions 902a, 902b; elongated portions 904; and y-axis electrodes (or transducers) 906a, 906b for measuring the motions of the y-axis proof mass section 918. The sensor 900 also includes an anchor 946 disposed substantially at the center and a drive decoupling frame 948 connected to the anchor 946 by multiple drive beams 950.

The x-axis accelerometer flexure 908a (or 908b) includes: an elongated slit (groove or gap) 930 formed in the elongated portion 904 of the y-axis proof mass section 918; and two slits (grooves or gaps) 932 that extend from the regions around anchors 905 toward the x axis. The distal ends of the slits 932 are spaced apart from each other to form a suspension linkage 934 having a substantially T-shape. The slits 932 separate the elongated portion 904 from the frame 952, where the frame 952 has a substantially rectangular shape. The slits 930 and 932 are large enough to permit the suspension linkage 934 to move through its design range without colliding with the elongated portion 904 and the frame 952. The anchors 905 are secured to the via wafer 108 (shown in FIG. 2) and holds the stationary plates of the y-axis electrodes 906a (or 906b) in place.

The y-axis accelerometer flexure 910b (or, 910a) includes a long slit (groove or gap) 940 and two short slits (grooves or gaps) 942 that are arranged substantially parallel to the long slit 940. The gap between the two short slits 942 and the long slit 940 forms a suspension linkage 944 having a substantially T-shape. The frame 952 is separated from the drive decoupling frame 948 by the slits 940 and 942. The slits 940 and 942 are large enough to permit the suspension linkage 944 to move through its design range without colliding with the frame 952 and the drive decoupling frame 948. The x-axis accelerometer flexures 908a, 908b and the y-axis accelerometer flexures 910a, 910b are connected to the drive decoupling frame 948, and allow the accelerometer function to be decoupled from the gyroscope operation.

It should be understood, of course, that the foregoing relates to exemplary embodiments of the invention and that modifications may be made without departing from the spirit and scope of the invention as set forth in the following claims.

What is claimed is:

1. A sensor for measuring a motion thereof, comprising:
   a frame;
   a first planar proof mass section attached to the frame by a first flexure;
   a second planar proof mass section attached to the frame by a second flexure; and
   an anchor secured to a wafer disposed beneath the first planar proof mass section and the second planar proof mass section,
   wherein the frame, the first planar proof mass section, and the second planar proof mass section are formed in a micromachined layer and are adapted to measure angular rates about three axes and linear accelerations about the three axes, and
   wherein the first planar proof mass section and the second planar proof mass section are configured to be driven, in phase, about the anchor.

2. A sensor as recited in claim 1, further comprising:
   a comb electrode configured to drive the first and second planar proof mass sections at a drive frequency about an axis normal to a plane, the micromachined layer being substantially disposed on the plane when the sensor is not externally disturbed.

3. A sensor as recited in claim 2, wherein the comb electrode includes a plurality of stationary fingers and a plurality of moving comb fingers.

4. A sensor as recited in claim 3, wherein the plurality of stationary fingers are connected to an anchor that is secured to a wafer disposed beneath the micromachined layer.

5. A sensor as recited in claim 2, wherein the second planar proof mass section includes a pair of wing portions disposed symmetrically about a first axis and the wing portions are adapted to move in opposite directions when the sensor is disturbed at an angular rate along a second axis perpendicular to the first axis.

6. A sensor as recited in claim 5, further comprising:
   a pair of gyro electrodes disposed beneath the micromachined layer, wherein the angular rate along the second axis is detected by measuring a variation of capacitance between the pair of gyro electrodes and the pair of wing portions.

7. A sensor as recited in claim 5, further comprising:
   a pair of accelerometer electrodes respectively connected to the pair of wing portions and disposed symmetrically about a first axis,
   wherein a linear acceleration of the sensor along the second axis is detected by measuring a variation of capacitance of the pair of accelerometer electrodes.

8. A sensor as recited in claim 7, wherein each accelerometer electrode is connected to an anchor that is secured to a wafer disposed beneath the micromachined layer.

9. A sensor as recited in claim 2, wherein the first proof mass section includes a pair of masses disposed symmetrically about a second axis and the pair of masses are adapted to move in opposite directions when the sensor is disturbed at an angular rate along a first axis perpendicular to the second axis.

10. A sensor as recited in claim 9, further comprising:
a pair of gyro electrodes disposed beneath the micromachined layer,
wherein the angular rate along the first axis is detected by measuring a variation of capacitance between the pair of masses and the pair of gyro electrodes.

11. A sensor as recited in claim 10, wherein a linear acceleration of the sensor along the axis normal to the plane is detected by measuring a variation of capacitance between the pair of masses and the pair of gyro electrodes.

12. A sensor as recited in claim 9, wherein the pair of masses are adapted to move in opposite directions when the sensor is disturbed at an angular rate along the axis normal to the plane.

13. A sensor as recited in claim 12, further comprising:
a pair of accelerometer electrodes respectively connected to the pair of masses and disposed symmetrically about the second axis,
wherein the angular rate along the axis normal to the plane is detected by measuring a variation of capacitance in the pair of accelerometer electrodes.

14. A sensor as recited in claim 13, wherein each accelerometer electrode is connected to an anchor that is secured to a wafer disposed beneath the micromachined layer.

15. A sensor as recited in claim 13, wherein a linear acceleration of the sensor along the first axis is detected by measuring a variation of capacitance in the pair of accelerometer electrodes.

16. A sensor as recited in claim 1,
wherein the anchor is located substantially at a center of the sensor.

17. A sensor as recited in claim 16, further comprising:
an inner frame connected to the anchor by a plurality of suspension beams; and
a plurality of flexures connected to the inner frame and the second proof mass section and adapted to provide a restoring force to the second proof mass section.

18. A sensor as recited in claim 17, further comprising:
a pair of gyroscope flexures connected to the second planar proof mass section and to the frame and adapted to provide a restoring torque to the second planar proof mass section.

19. A sensor as recited in claim 1, wherein the first flexure includes two pairs of gyroscope flexures, each said gyroscope flexure having two elongated beams.

20. A sensor as recited in claim 1, further comprising:
a pair of flexures connected to the frame and the second planar proof mass section, each said flexure including a gyro spring configured to provide a restoring torque along a second axis and two accelerometer springs configured to provide a restoring torque along the second axis.

21. A sensor as recited in claim 20, wherein each said flexure includes a linkage, each end of the linkage being connected to a corresponding one of the two accelerometer springs, the gyro spring being connected to a midpoint of the linkage.

22. A device for measuring a motion thereof, comprising:
a first wafer;
a device layer including:
a frame;
a first planar proof mass section attached to the frame by a first flexure;
a second planar proof mass section attached to the frame by a second flexure; and
an anchor secured to a wafer disposed beneath the frame, the first planar proof mass section, and the second planar proof mass section,
wherein the frame, the first planar proof mass section, and the second planar proof mass section are formed in a micromachined layer and are adapted to measure angular rates about three axes and linear accelerations about the three axes, and
wherein the first planar proof mass section and the second planar proof mass section are configured to be driven, in phase, about the anchor; and
a second wafer, the first and second wafer being bonded to the device layer.

23. A device layer as recited in claim 22, wherein the first wafer is a cap wafer.

24. A device layer as recited in claim 23, wherein the second wafer is a via wafer or an ASIC wafer.

25. A device as recited in claim 22, wherein the second wafer includes one or more electrodes configured to measure an angular rate of at least one of the first and second planar proof mass sections.

* * * * *